United States Patent
Cheng et al.

(10) Patent No.: US 7,036,099 B2
(45) Date of Patent: Apr. 25, 2006

(54) INTEGRATED CIRCUIT CAPABLE OF LOCATING FAILURE PROCESS LAYERS

(75) Inventors: An-Ru Andrew Cheng, Hsin-Chu (TW); Chang-Song Lin, Hsinchu (TW); Tzu-Chun Liu, Taipei (TW); Huan-Yung Tseng, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 202 days.

(21) Appl. No.: 10/626,634

(22) Filed: Jul. 25, 2003

(65) Prior Publication Data

US 2005/0022142 A1   Jan. 27, 2005

(51) Int. Cl.
*G06F 17/50*   (2006.01)
(52) U.S. Cl. .................... 716/4; 716/5; 716/6
(58) Field of Classification Search ............. 716/4–6, 716/8–11; 714/724–726, 737; 324/765; 365/201
See application file for complete search history.

(56) References Cited

U.S. PATENT DOCUMENTS

| | | | | |
|---|---|---|---|---|
| 5,654,970 A | * | 8/1997 | DaCosta et al. | 714/726 |
| 6,233,184 B1 | * | 5/2001 | Barth et al. | 365/201 |
| 6,411,116 B1 | * | 6/2002 | DeHaven et al. | 324/765 |
| 6,426,904 B1 | * | 7/2002 | Barth et al. | 365/201 |
| 6,618,830 B1 | * | 9/2003 | Balachandran et al. | 714/737 |

* cited by examiner

*Primary Examiner*—Vuthe Siek
*Assistant Examiner*—Naum Levin
(74) *Attorney, Agent, or Firm*—Winston Hsu

(57) ABSTRACT

An integrated circuit for locating failure process layers. The circuit has a substrate with a scan chain disposed therein, having scan cells connected to form a series chain. Each connection is formed according to a layout constraint of a minimum dimension provided by design rules for an assigned routing layer. Since the connection in the assigned routing layer is constrained to a minimum, the scan chain is vulnerable to variations in processes relevant to the assigned routing layer. The scan chain makes it easier to locate processes causing low yield rate of the scan chain.

3 Claims, 6 Drawing Sheets

INTEGRATED CIRCUIT CAPABLE OF LOCATING FAILURE PROCESS LAYERS

BACKGROUND OF THE INVENTION

1. Field of the Invention

The present invention relates to an integrated circuit, and more particularly, to an integrated circuit capable of locating failure process layers on a chip.

2. Description of the Related Art

For logic process debugging, memory and FPGA are usually selected. Fault isolation can be achieved through a simple bit mapping process, and further, fault isolation to locate appropriate failure process layers is also possible using the bit map signature. However, fabless ASIC companies do not have such kind of products for new process debugging and yield learning, resulting in a long learning curve for yield enhancement. Further, fabless ASIC companies must cooperate with foundry fabs closely for process debugging or development, for example accepting products on wafers having passed WAT (wafer acceptance test) of foundry fab. Unfortunately, products sometimes still experience poor yield caused by process problems. Fabless ASIC facilities currently do not have effective methods and products for fab process debugging, especially in backend process learning.

SUMMARY OF THE INVENTION

It is therefore an object of the present invention to locate failure process layers and appropriate failure location for new process debugging.

Accordingly, the present invention provides an integrated circuit for locating failure process layers on a chip. The integrated circuit has a substrate with a scan chain disposed therein. The scan chain has scan cells connected to form a series chain. Each connection is formed according to a layout constraint with minimum dimensions provided by design rules for an assigned routing layer.

Since the connection in the assigned routing layer is constrained to a minimum, the scan chain is vulnerable to variations in processes relevant to the assigned routing layer. This scan chain makes it easier to find processes causing low yield rate thereof.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 1:
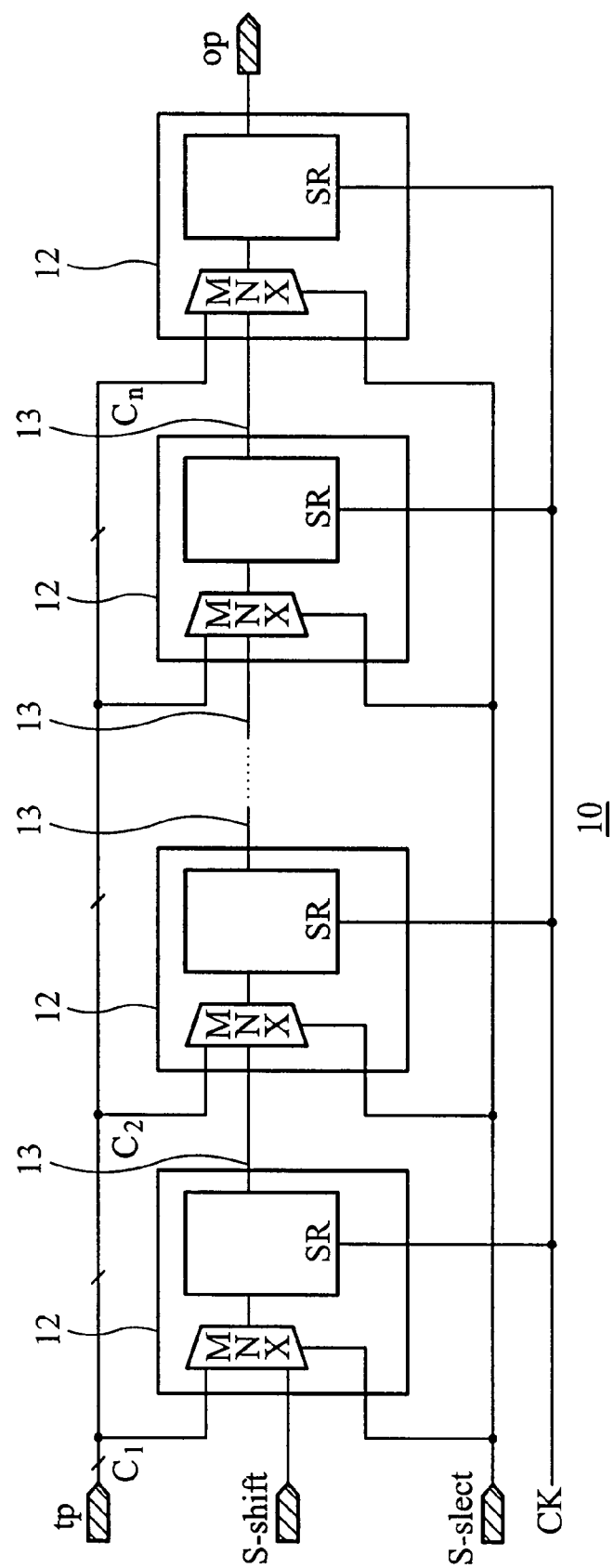
FIG. 1 is a schematic diagram of a scan chain according to the present invention.

FIG. 1 is a schematic diagram of a scan chain according to the present invention. In FIG. 1, a scan chain 10 has a plurality of scan cells 12, connected in series via connections 13 therebetween. Each scan cell 12, for example, is composed of a multiplexer (MUX) and a shift register (SR) All the connections 13 must meet a layout constraint.

The layout constraint includes a minimum dimension of design rules and limits routing freedom of connection between each two scan cells during placement and routing. Thus, after placement and routing, the outcome connections must meet the requirement in the layout constraint. This requirement includes a minimum dimension provided by design rules. The layout constraint is included to make the scan chain more sensitive to defect or process variation in a fab. The layout constraint of the present invention, for example, limits each connection of two scan cells to passing through at least one assigned routing layer and the physical structure of the connection in the assigned routing layer must have a minimum dimension provided by design rules. In other words, the most likely causes of failure of the scan chain are processes relative to form and pattern of the assigned routing layer.

Typically, during testing, codes $C_1$, $C_2$, . . . etc., as a test pattern (tp) or output result of integrated circuits, are input in parallel into the shift registers of the scan cells 12 according to one state of the signal S-select. These codes can be sequentially shifted out according to the other state of the signal S-select and the swinging clock signal CK. By checking the output codes, it can be determined whether the logic functions of integrated circuits are correct.

The benefit of the scan chain is the convenience in locating relevant weak processes in manufacturing. For example, if an IC product with the scan chain of the present invention faces a problem of low yield during product testing and the manufacturer confirms WAT data of the IC product to be within specification, it can be determined whether the scan chain in each IC is functional by comparing the input in parallel codes to the sequential output codes from the scan chain. If a lot of the scan chains in IC chips shows errors, it is likely that the scan chains are affected or have failed due to processes relevant to the layout constraints. Through failure analysis, such speculation can be verified, indicating that ICs must be designed to lessen the influence of the identified processes in consideration of product yield rate. Additionally, the verification can be fed back to the semiconductor manufacturer for further process improvement.

First Embodiment

Figure 2:
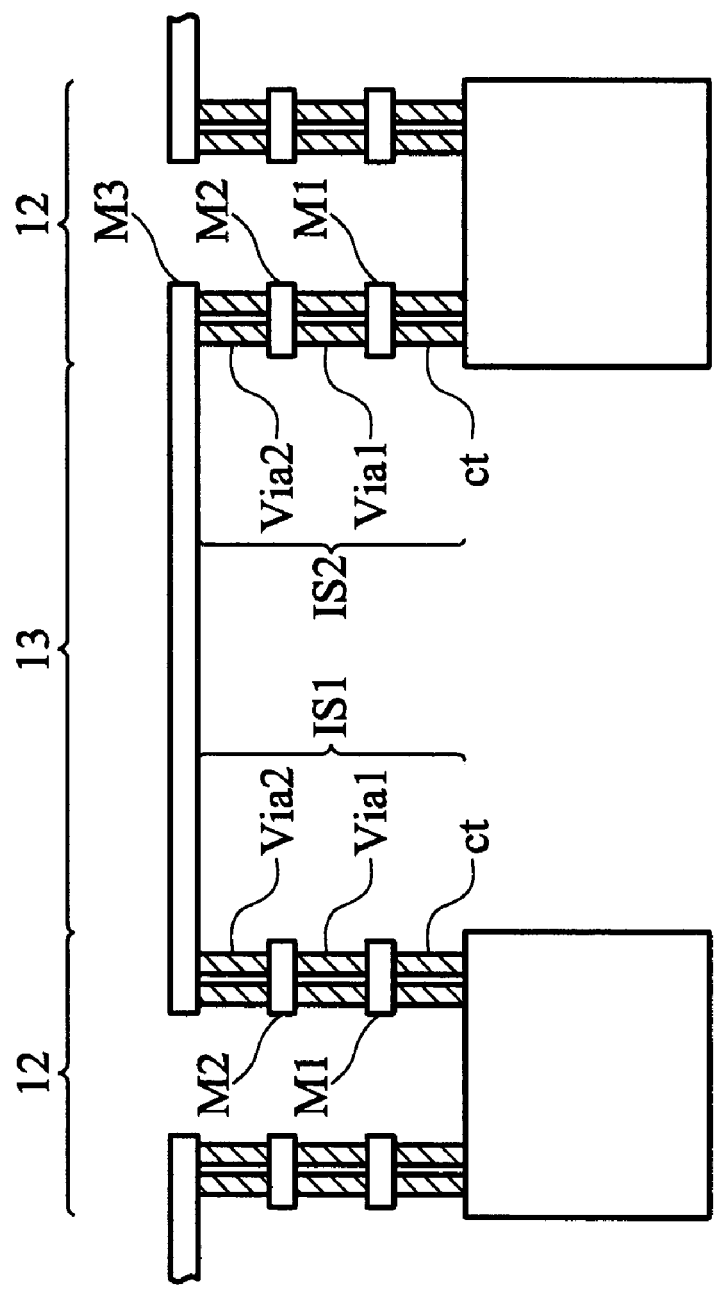
FIG. 2 shows an example of a portion of the scan chain in FIG. 1, illustrating a connection between two scan cells.

FIG. 2 shows an example of a portion of the scan chain in FIG. 1, illustrating a connection 13 between two scan cells 12. Each connection 13 between each two scan cells is formed according to a layout constraint limiting each connection 13 between each two scan cells 12 to pass through only metal 3 layer (M3), as shown in FIG. 2. In other words, connection 13 is only composed of a metal line in M3. According to the influence of processes relative to forming the M3 layer, the layout constraint also limits the width of metal line of M3 to no exceeding critical dimension (CD) of M3, as provided by the semiconductor manufacturer. Violation of design rules renders low yield and is thus not acceptable. A line with a width of CD implies that this line can easily be broken or disconnected due to process variation.

In this case, each of the first and second interconnect structures (IS1 and IS2) is composed of two conductive layers M1 and M2 and plug layers contact (ct), Via1 and Via2. These interconnect structures (IS1 and IS2) are located inside the two connected scan cells layout and act as part of the two scan cells. To exclude the possibility of failure in the scan cells, a further layout constraint for IS1 and IS2 can be added, such as, for example, widths of metal lines of M1 in IS1 and IS2 must exceed CD of M1 to prevent disconnection in M1, or that there must be exceeding one plug in a plug layer in an interconnect structure to keep the interconnect structures available should one of the plugs fail. As shown in FIG. 2, there are two plugs in a plug layer in a interconnect structure.

If scan chains of FIG. 2 render a low yield rate and are frequently recognized to be broken, having a disconnection somewhere between two scan cells therein, it is likely that processes for forming or defining M3 must take responsibility for the low yield rate, since failure caused by a plug layer occurs when all the plugs of a plug layer in an interconnect structure fail. Since layout constraints of this embodiment require at least two plugs in an interconnect structure, providing a minimal failure possibility, Contact (ct), Via1 and Via2 should not cause the failure. M2 and M1 should thus not experience disconnection since the widths of lines therein are all required to a line width exceeding CD. Therefore, the most likely cause is line breakage in M3, constrained to a line width of CD.

Variations to this embodiment include layout constraints limiting connection between each two scan cells to only pass through M1, or only M2 to monitor processes relative thereto. Scan chains can have similar layout constraints respectively corresponding to different metal layers to monitor the relationship between yield rate and relative processes.

Second Embodiment

Difficulty in placement and routing may occur if each connection between two scan cells is constrained to formation by only one single metal layer. More flexibility for the layout constraint is acceptable to achieve the purpose of the invention of the present invention.

Figure 3:
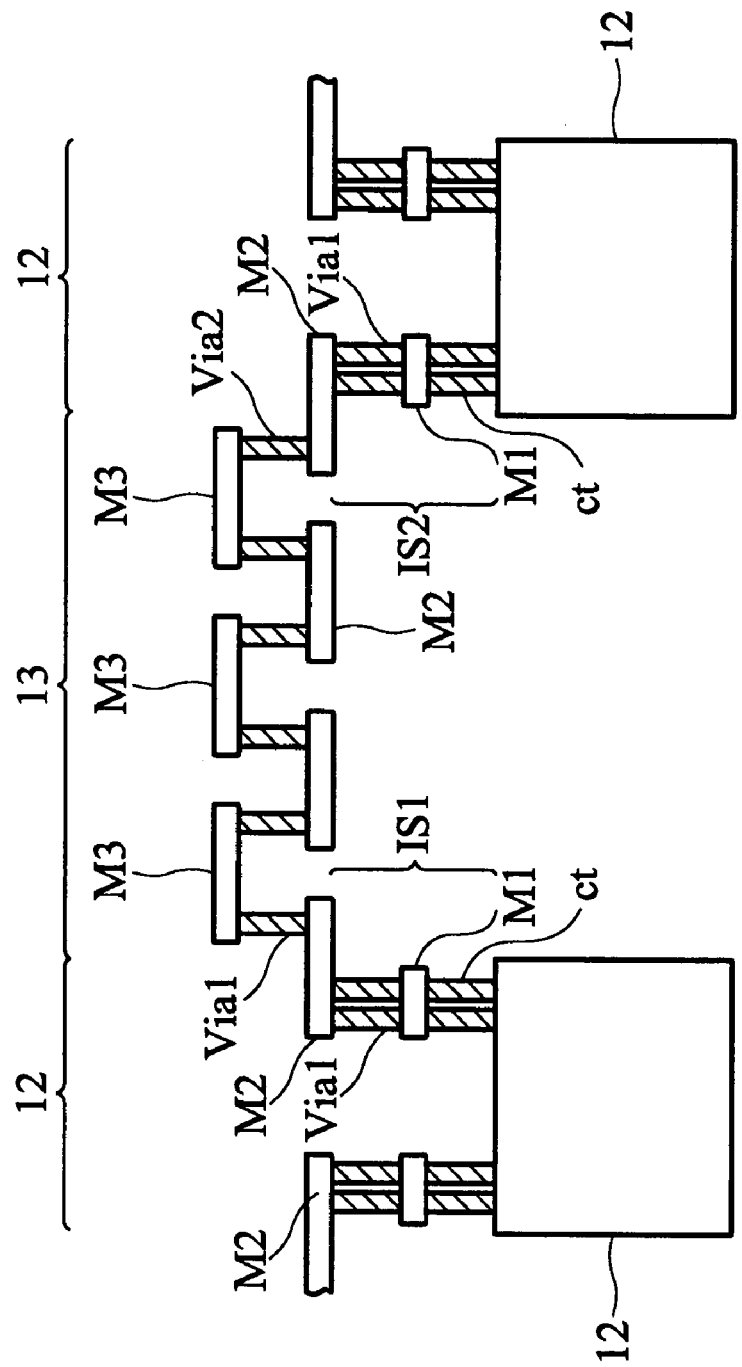
FIG. 3 is a diagram illustrating the second embodiment of scan chain 10 according to the present invention.

FIG. 3 is a diagram illustrating the second embodiment of scan chain 10 according to'the present invention. Not only a single metal layer but also a plurality of metal layers can be assigned and limited in the layout constraint for a scan chain. The layout constraint for a scan chain in FIG. 3 limits each connection between two scan cells to passing through only M2, M3, or Via2 and the metal lines in the connection to line width of only CD of M2 or M3. Such a layout constraint limits line formation in M2 or M3 the most likely causes of disconnection in the scan chain. To exclude failure possibility in other layers, other further layout constraints can be included to guarantee robust connection. A layout constraint for robust connection, for example, prohibits forming a single plug of a plug layer to link two metal layers or forming a metal line with a width of CD in other metal layers, as shown in FIG. 2. If low yield rate occurs with scan chains as that in FIG. 3, it can be determined whether disconnection in the scan chains is due line breakage of M2 or M3 and provide useful and effective feedback to a semiconductor manufacturer or a design house.

Third Embodiment

The yield impact for processes relevant to a plug layer can also be monitored.

Figure 4:
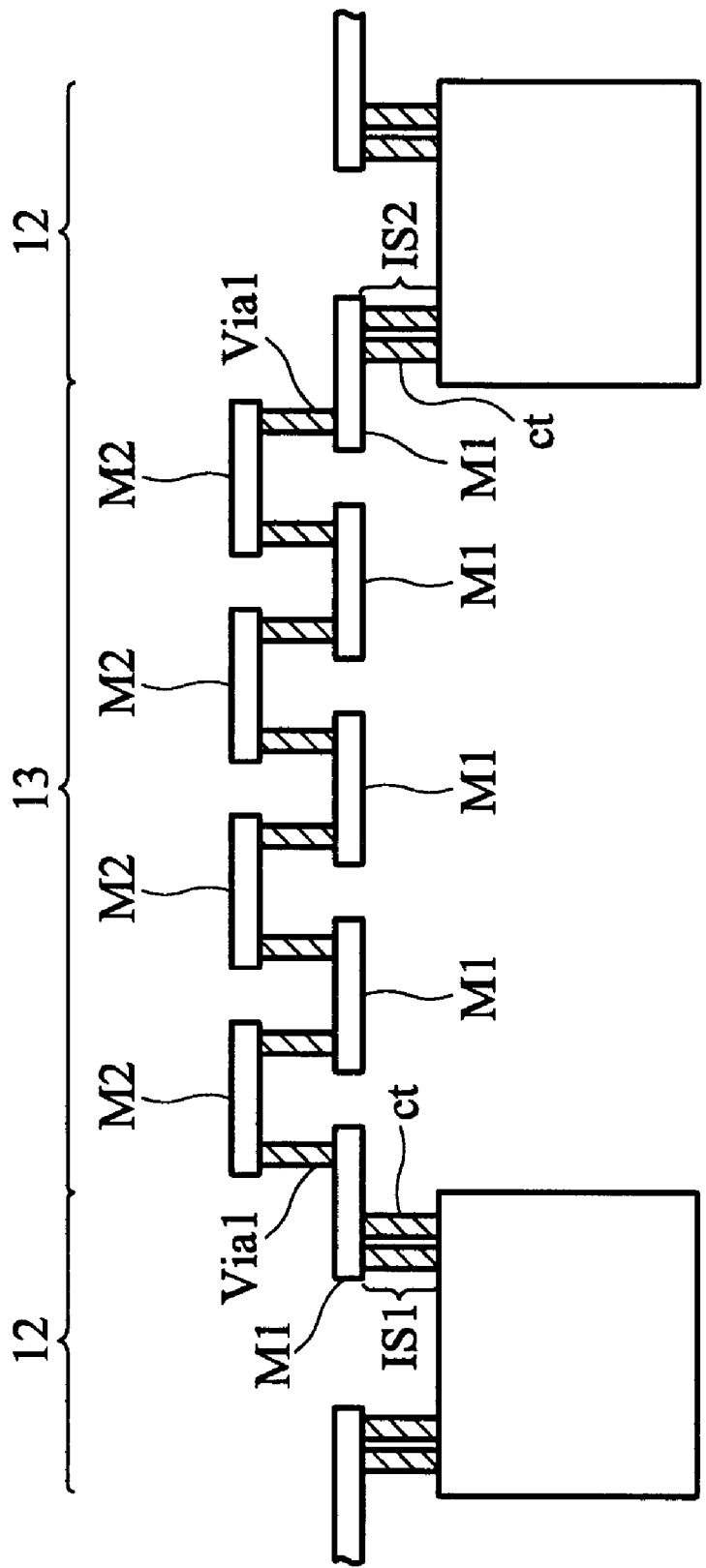
FIG. 4 is a diagram illustrating the third embodiment of scan chain 10 according to the present invention.

FIG. 4 is a diagram illustrating the third embodiment of scan chain 10 according to the present invention. The layout constraint for the scan chain in FIG. 3 limits each connection between two scan cells to passing through only M1, M2 or Via1, and, in the connection, a metal line of M1 and a metal line of M2 to connection by a single plug with a minimum diameter. To exclude failure possibility in layers other than Via1, other further layout constraints can be included to guarantee robust connection. A layout constraint for robust connection can be, for example, prohibition of forming a single plug of Contact to link a line of M1 and a stripe in Diffusion or of forming a metal line with a width of CD in all metal layers, as shown in FIG. 4. As is self-explanatory by referencing the previous embodiments, such a scan chain in FIG. 4 is vulnerable to defect or process variation during formation of the plugs of Via1. If the scan chain of FIG. 4 fails, processes relevant to forming plugs of Via1 are the most likely causes.

Fourth Embodiment

More flexibility for layout constraints is acceptable to achieve the purpose of the present invention.

Figure 5:
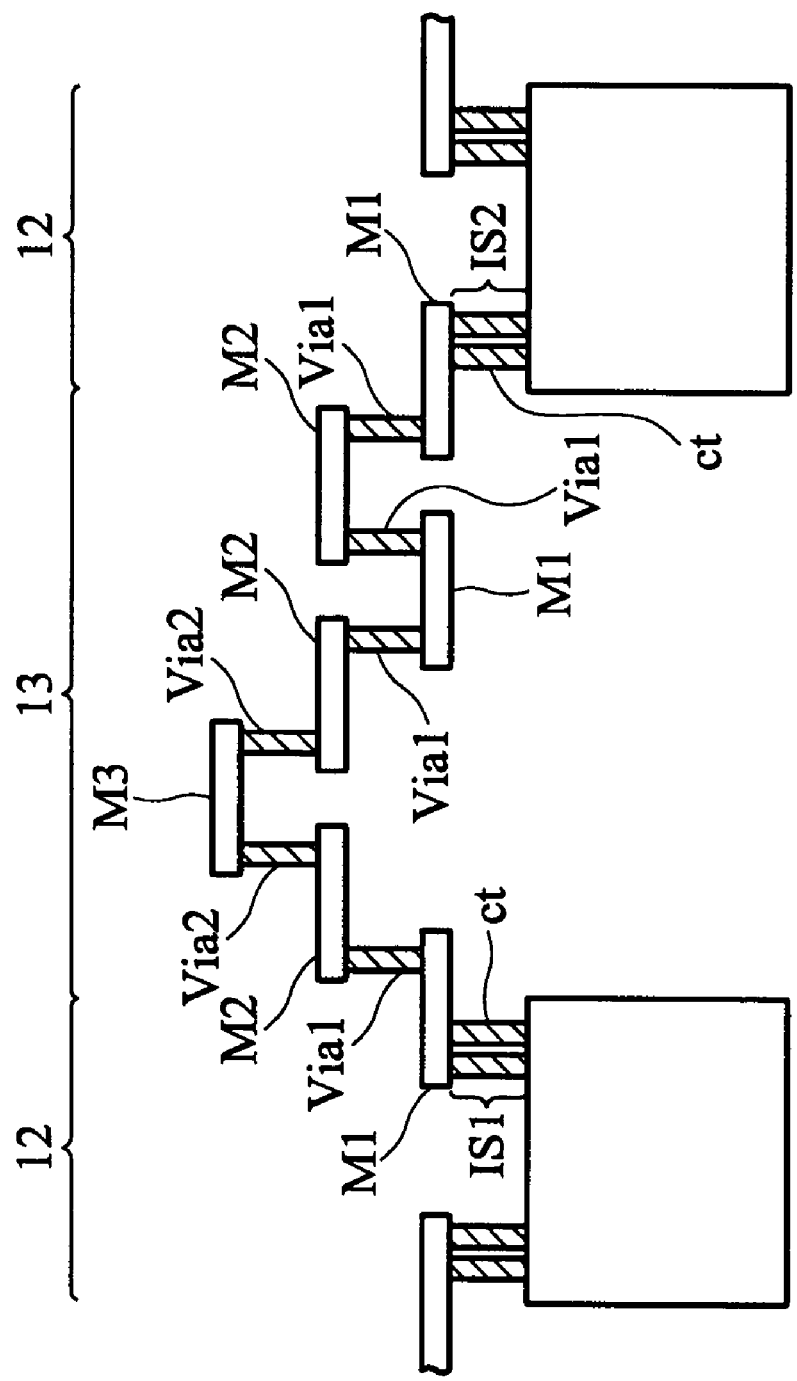
FIG. 5 is a diagram illustrating the fourth embodiment of scan chain 10 according to the present invention.

FIG. 5 is a diagram illustrating the fourth embodiment of scan chain 10 according to the present invention. The layout constraint for the scan chain in FIG. 5 limits each connection between two scan cells to passing through at least M1, M2, M3, Via1 and Via2, and, in the connection, any metal line of M1, M2 or M3 to a line width of CD and only a single plug of Via1 or Via2 to connect two metal lines. This layout constraint makes the connection 13 vulnerable to defect or variation during processes for forming M1, Via1, M2, Via2 and M3. A layout constraint for robust connection in other layers can be easily retrieved and is not redundantly stated here.

The layout constraint for the scan chain in FIG. 5 can also limit each connection 13 to passing through at least M2 and, in the connection 13, any metal line of M2 to line width of CD. Even if the connection 13 in FIG. 5 consists of plugs of Via1 and Via2 and metal lines of M1, M2 and M3, this layout constraint makes the connection 13 vulnerable to defect or variation during processes for forming M2.

Figure 6:
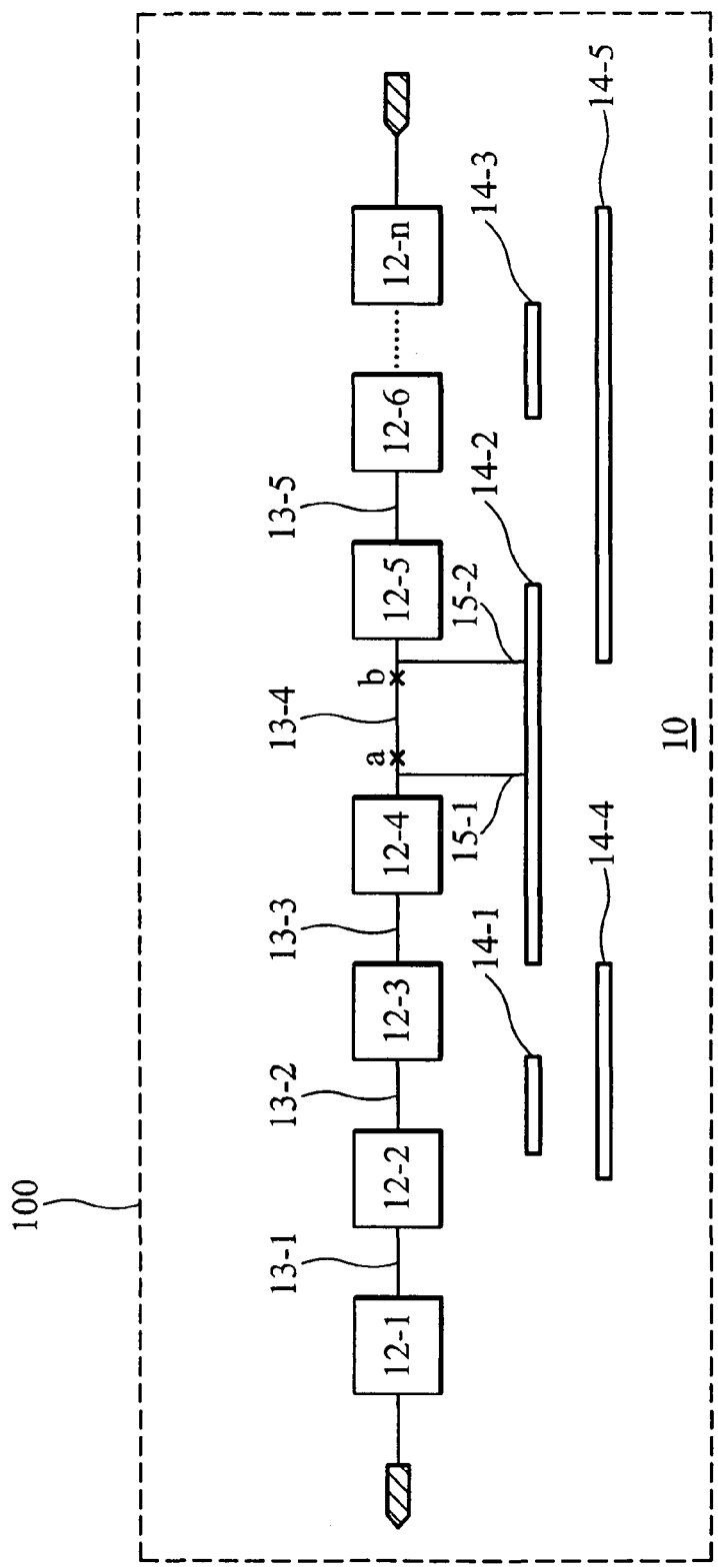
FIG. 6 shows a scan chain in together with an auxiliary routing net according to the present invention.

The present invention further provides an auxiliary routing net disposed on the substrate 100 adjacent to the scan chain 10 as shown in FIG. 6. FIG. 6 shows a scan chain together with an auxiliary routing net according to the present invention. The auxiliary routing net consists of metal lines (14-1~14-5) with different lengths, substantially parallel to the scan chain 10. Each metal line in the auxiliary routing net can be formed by an arbitrary metal layer.

This auxiliary routing net has no contribution when the scan chain 10 functions properly. Therefore, it can be positioned in any empty area not occupied after placement and routing, adjacent to the scan chain 10. Forming the auxiliary routing net renders no extra wafer cost.

If the scan chain 10 malfunctions, the auxiliary routing net allows convenient failure analysis. By the technology of focus ion beam (FIB), the portion of the connection 13 can be replaced by a metal line in the auxiliary routing net, locating the failure in the connection 13.

The technology of FIB is usually used to extract or deposit material on the surface of an object, depending on type and energy of the ions used. FIB can cut metal lines, extract isolating material from a metal line or form extra electrical connection for the metal lines on an IC.

For example, if the output codes of the scan chain 10 in FIG. 6 indicate disconnection possibly occurring in the connection 13-4 and the scan chain 10 is formed to follow a layout constraint, making itself vulnerable to processes of forming metal lines of M2, for failure analysis to locate the failure position, FIB can cut at two ends a and b of the connection 13-4 to positively sever the link between scan cells 12-4 and 12-5. Then, by depositing metal ions on the surface of the IC, two extra metal strips 15-1 and 15-2 near the ends a and b can respectively bridge from scan cell 12-4 to metal line 14-2 and from scan cell 12-5 to metal line 14-2. The portion of the connection between ends a and b is replaced by the metal line 14-2 and metal strips 15-1 and 15-2. Here the scan cells 12-5 and 12-4 are reconnected through metal line 14-2 in the auxiliary routing net and a newly intact scan chain is formed.

If the new scan chain functions properly during function testing, it can be concluded that failure of the original scan chain is indeed located between the cut ends a and b, unless located somewhere else in the connection 13-4. Changing the position of the ends a and b reduces the distance therebetween, thereby narrowing the range of failure location. Thus, repeated execution of the method disclosed accurately locates the failure, with the help of the auxiliary routing net.

The required length of a metal line in an auxiliary routing net has no limitation. It may be only long enough to replace a connection in the scan chain, as the metal line 14-1 in FIG. 7, or long enough to run across several scan cells, wherein a new scan chain with different output codes will be formed if such a long metal line is used to replace questionable scan cells.

In comparison with the prior art, in which IC designers are unable to determine the manufacturing processes responsible for low yield rate of a IC product, the scan chain of the present invention provides an indicator allowing location of responsible processes. According to the present invention, the layout constraint for the scan chain strongly links the failure of the scan chain to some processes in manufacturing. The scan chain thus addresses the source of low yield rate.

Furthermore, the auxiliary routing net of the present invention provides isolation of failure location in the scan chain, easing the effort of failure analysis.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit on a chip, comprising:
    a substrate;
    at least one scan chain disposed in the substrate, with scan cells connected to form a series chain, each connection being formed according to a layout constraint with a minimum dimension provided by design rules for an assigned routing layer; and
    an auxiliary routing net positioned in parallel beside the scan chain,
    wherein the auxiliary routing net has metal lines of different lengths, and the auxiliary routing net does not function when the scan chain is originally formed.

2. The integrated circuit as claimed in claim 1, wherein one of the metal lines has sufficient length to replace one of the connections in the scan chain.

3. The integrated circuit as claimed in claim 1, wherein one of the metal lines has a length equal to at least two scan cells in the scan chain.

* * * * *